(12) United States Patent
Hui et al.

(10) Patent No.: US 11,184,036 B2
(45) Date of Patent: Nov. 23, 2021

(54) METHODS AND DEVICES FOR PUNCTURING A POLAR CODE

(71) Applicant: Telefonaktiebolaget LM Ericsson (publ), Stockholm (SE)

(72) Inventors: Dennis Hui, Sunnyvale, CA (US); Yufei Blankenship, Kiideer, IL (US); Michael Breschel, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/496,728

(22) PCT Filed: Mar. 23, 2018

(86) PCT No.: PCT/IB2018/052007
§ 371 (c)(1),
(2) Date: Sep. 23, 2019

(87) PCT Pub. No.: WO2018/173006
PCT Pub. Date: Sep. 27, 2018

(65) Prior Publication Data
US 2020/0321986 A1    Oct. 8, 2020

Related U.S. Application Data

(60) Provisional application No. 62/476,584, filed on Mar. 24, 2017.

(51) Int. Cl.
H03M 13/00    (2006.01)
H03M 13/13    (2006.01)

(52) U.S. Cl.
CPC ....... *H03M 13/6362* (2013.01); *H03M 13/13* (2013.01)

(58) Field of Classification Search
CPC .......................... H03M 13/6362; H03M 13/13
See application file for complete search history.

(56) References Cited

U.S. PATENT DOCUMENTS

| | | | |
|---|---|---|---|
| 6,542,116 B1* | 4/2003 | Sahai | G01S 19/23 342/357.62 |
| 2013/0170565 A1* | 7/2013 | Azadegan | H04N 19/557 375/240.27 |
| 2014/0269577 A1* | 9/2014 | Hammarwall | H04B 7/0634 370/329 |

(Continued)

OTHER PUBLICATIONS

PCT International Search Report for International application No. PCT/IB2018/052007—dated Jul. 10, 2018.

(Continued)

*Primary Examiner* — Guy J Lamarre
(74) *Attorney, Agent, or Firm* — Baker Botts, LLP

(57) ABSTRACT

Methods and devices for puncturing of a polar code in a wireless network, wherein nested puncturing sets are determined based on a puncturing order which is determined based on a reliability order of information bit channels, so that only one index sequence needs to be stored for both the determination of the information set and the determination of the punctured set and so that puncturing does not require to adjust the information set at error prone indexes corresponding to puncturing indexes. The puncturing order might start with indexes corresponding to high reliability bit channels or to low reliability bit channels.

23 Claims, 11 Drawing Sheets

(56) References Cited

U.S. PATENT DOCUMENTS

| | | | | |
|---|---|---|---|---|
| 2016/0337056 A1* | 11/2016 | Frenne | ............... | H04B 7/0695 |
| 2018/0026663 A1* | 1/2018 | Wu | ................ | H03M 13/6362 |
| | | | | 714/776 |
| 2018/0198564 A1* | 7/2018 | Yang | .................... | H04L 1/0067 |
| 2019/0305799 A1* | 10/2019 | Gabry | ............... | H03M 13/033 |
| 2019/0372608 A1* | 12/2019 | Wei | ................ | H03M 13/6356 |
| 2020/0036476 A1* | 1/2020 | Yang | .................... | H04L 1/0068 |

OTHER PUBLICATIONS

PCT Written Opinion of the International Searching Authority for International application No. PCT/IB2018/052007—dated Jul. 10, 2018.

3GPP TSG-RAN WG1 #88bis; Spokane, U.S.; Source: Ericsson; Title: Rate Matching Schemes for Polar Codes (R1-1704317)—Apr. 3-7, 2017.

An Incremental Redundancy Hybrid ARQ Scheme Via Puncturing and Extending of Polar Codes by Hamid Saber and Ian Marsland; IEEE Transactions on Communications, vol. 63, No. 11—Nov. 2015.

\* cited by examiner

METHODS AND DEVICES FOR PUNCTURING A POLAR CODE

PRIORITY

This nonprovisional application is a U.S. National Stage Filing under 35 U.S.C. § 371 of International Patent Application Serial No. PCT/IB2018/052007 filed Mar. 23, 2018 and entitled "METHODS AND DEVICES FOR PUNCTURING A POLAR CODE", which claims priority to U.S. Provisional Application No. 62/476,584, filed Mar. 24, 2017, both of which are hereby incorporated by reference in their entirety.

TECHNICAL FIELD

The present disclosure relates, in general, to wireless communications and, more particularly, methods and systems for puncturing-based rate matching for Polar codes.

BACKGROUND

Polar codes, as proposed by E. Arikan in "Channel Polarization: A Method for Constructing Capacity-Achieving Codes for Symmetric Binary-Input Memoryless Channels," as published in IEEE Transactions on Information Theory, vol. 55, pp. 3051-3073, July 2009, are the first class of constructive coding schemes that are provable to achieve the symmetric capacity of the binary-input discrete memoryless channels under a low-complexity successive cancellation (SC) decoder. However, the finite-length performance of Polar codes under SC is not competitive compared to other modern channel coding schemes such as low-density parity-check (LDPC) codes and Turbo codes. Later, SC list (SCL) decoder was proposed by I. Tal and A. in "List Decoding of Polar codes," as published in Proceedings of IEEE Symp. Inf. Theory, pp. 1-5, 2011. SCL decoder can approach the performance of optimal maximum-likelihood (ML) decoder. By concatenating a simple CRC coding, the performance of concatenated Polar code may be competitive with that of well-optimized LDPC and Turbo codes. As a result, Polar codes are being considered as a candidate for future 5G wireless communication systems.

The main idea of Polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e. error free) while the rest of them are nearly useless (i.e. totally noisy). The point is to use the nearly perfect channel to transmit data to the receiver while setting the input to the useless channels to have fixed or frozen values (e.g. 0) known to the receiver. For this reason, those input bits to the nearly useless and the nearly perfect channel are commonly referred to as frozen bits and non-frozen (or information) bits, respectively. Only the non-frozen bits are used to carry data in a Polar code. Loading the data into the proper information bit locations directly impacts the performance of a Polar code. FIG. 1 illustrates an example Polar code structure. Specifically, FIG. 1 illustrates the structure of a Polar code with a length of 8 (N=8).

FIG. 2 illustrates an example Polar code encoder with a length of 8 (N=8). Specifically, FIG. 2 illustrates the labeling of intermediate information bits $s_{l,i}$, where $l \in \{0, 1, \ldots, n\}$ and $i \in \{0, 1, \ldots, N-1\}$ during Polar encoding with N=8. The intermediate info bits are related by the following equation:

$$s_{l+1,i} = s_{l,i} \oplus s_{l,i+2^l}, \text{ for } l \in \{0,1,\ldots,n-1\} \text{ and } i \in \{0,1,\ldots,N-1\},$$

with $s_{0,i} \equiv u_i$ be the info bits, and $s_{n,i} \equiv x_i$ be the code bits, for $i \in \{0, 1, \ldots, N-1\}$.

As an example, a Polar encoder may use the general indices arrangement depicted in FIG. 2. The indices arrangement includes input and output indices. However, other ways of arranging the input/output indices are possible and may achieve the same net effect of encoding. The disclosed methods can be modified accordingly for other ways of indexing without departing from the spirit of the invention.

Denote a row vector $(a_0, \ldots, a_{N-1})$ by $a_0^{N-1}$. The input vector to the Polar encoder, $u_0^{N-1}$, consists of the K information bit $c_i$, $0 \le i \le K-1$, and the (N-K) frozen bits of value 0. The index set of information bits $c_i$ is denoted as $\mathcal{A}$, where $\mathcal{A}$ is a subset of indices $\{0, 1, 2, \ldots, N-1\}$. The index set of the frozen bits is denoted as $\mathcal{A}^c$, where $\mathcal{A}^c \triangleq \{0, 1, \ldots, N-1\} \setminus \mathcal{A}$. Bit value of $u_i$ is assigned as:

$$u_j = \begin{cases} c_i, & \text{if } j = \mathcal{A}(i) \\ 0, & \text{otherwise} \end{cases}$$

The output of the Polar encoder is:

$$x_0^{N-1} = u_0^{N-1} G_N$$

where $G_N$ is the generator matrix of size N. In FIG. 2, the generator matrix for N=2 is given by $$G_2 = \begin{bmatrix} 1 & 0 \\ 1 & 1 \end{bmatrix}.$$

In general, generator matrix $G_N$ is defined by $$G_n = F^{\otimes n}$$

for any $N=2^n$, $n \ge 1$, where $$F = \begin{bmatrix} 1 & 0 \\ 1 & 1 \end{bmatrix},$$

and $F^{\otimes n}$ is the n-th Kronecker power of matrix F.

It can be illustrated that Polar code of length-N is constructed recursively from two Polar codes of length N/2.

$$G_N = \begin{bmatrix} F^{\otimes n-1} & 0 \\ F^{\otimes n-1} & F^{\otimes n-1} \end{bmatrix}$$

$$x_0^{N-1} = u_0^{N-1} \begin{bmatrix} F^{\otimes n-1} & 0 \\ F^{\otimes n-1} & F^{\otimes n-1} \end{bmatrix} = \begin{bmatrix} (u_0^{N/2-1} \oplus u_{N/2-1}^{N-1}) F^{\otimes n-1} & u_{N/2-1}^{N-1} F^{\otimes n-1} \end{bmatrix}$$

$$x_0^{N-1} =$$

$$u_0^{N-1} \begin{bmatrix} F^{\otimes n-1} & 0 \\ F^{\otimes n-1} & F^{\otimes n-1} \end{bmatrix} = \begin{bmatrix} (u_0^{N/2-1} F^{\otimes n-1}) \oplus (u_{N/2-1}^{N-1} F^{\otimes n-1}) & u_{N/2-1}^{N-1} F^{\otimes n-1} \end{bmatrix}$$

FIG. 3 illustrates a general recursive construction where two copies of $W_{N/2}$ are used.

A major limitation of conventional Polar codes is that the codeword length or code length must be a power of two.

Puncturing of coded bits by, for example, dropping some coded bits without transmitting them, is a natural method to support the granularity in codeword length required in practice. Also, when the desired codeword length is only slightly over a power of two, it is more practical to just repeat some of the coded bits instead of demanding the receiver to operate at twice the codeword length, which in turn increases the latency and power consumption and imposes a more stringent hardware requirement on processing speed and memory. Such a process of generating codewords with any desired length (typically through puncturing or repetition) is referred to as a rate-matching process. It is unclear how puncturing and repetition of Polar encoded bits should be performed in an efficient manner while maintaining a close-to-optimum performance.

For each puncturing pattern with p punctured code bits, there is a set of corresponding bit-channels at the input of the encoder that needs to be avoided in order to prevent a likely error. These bad bit-channels that occur as a result of puncturing are referred to as catastrophic bit-channels and should be frozen at the input of the encoder. However, when the locations of these catastrophic bit channels overlap with those of the information bit locations (i.e. the locations that carry data bits), the information set needs to be readjusted to avoid catastrophic behavior at the decoder. This means that whenever the code block length is changed, the information set needs to be re-adjusted.

Different puncturing methods have been proposed. For example, L. Zhang discusses some puncturing methods in "On the Puncturing Patterns for Punctured Polar Codes," as published in Proceeding of 2014 IEEE ISIT, pp. 121-125, 2014. Puncturing methods are also discussed by R. Wang and R. Liu in "A Novel Puncturing Scheme for Polar Codes" as published in IEEE Communication Letters vol. 18, No. 12, December 2014. All of the disclosed techniques puncture in such a way as to cause the catastrophic bit channels to overlap with the information set and thus requires adjustment of information set according to the target block length.

SUMMARY

To address the foregoing problems with existing solutions, disclosed is methods and systems for puncturing-based rate matching for Polar codes. Specifically, methods and systems are disclosed that include determining a set of indices of code bits to be punctured in order to attain a target block length that is different from the native block length of a Polar code, which must be power-of-two. More specifically, the determination may be done according to an ordered code-bit index sequence, which may represent the relative ranking of each code bit. In a particular embodiment, this ordered code-bit index sequence may be directly derived from the ordered bit-channel index sequence used to determine the set of bit-channels of the Polar code used to carry data bits.

In certain embodiments, the systems and methods may be implemented in or by a wireless device, which may include a user equipment (UE), and/or a network node, which may include a eNodeB (eNB).

According to certain embodiments, a method by a transmitter includes determining, at an output of a Polar encoder, a set of punctured code bit indices based on a nested sequence of a plurality of sets of punctured code-bit indices.

According to certain embodiments, a transmitter includes processing circuitry configured to determine, at an output of a Polar encoder, a set of punctured code bit indices based on a nested sequence of a plurality of sets of punctured code-bit indices.

According to certain embodiments, a method by a transmitter for puncturing-based rate-matching on an output of a Polar encoder includes selecting K bit-channel indices from an ordered bit-channel index sequence and selecting p code-bit indices from an ordered code-bit index sequence. For a number of data bits (K), K bit-channels are selected from the ordered bit-channel index sequence. For a number of punctured bits (p), p code-bit indices are selected from the ordered code-bit index sequence.

According to certain embodiments, a transmitter includes processing circuitry configured to select K bit-channel indices from an ordered bit-channel index sequence and select p code-bit indices from an ordered code-bit index sequence. For a number of data bits (K), K bit-channels are selected from the ordered bit-channel index sequence. For a number of punctured bits (p), p code-bit indices are selected from the ordered code-bit index sequence.

Certain embodiments of the present disclosure may provide one or more technical advantages. For example, certain embodiments may derive an ordered code-bit index sequence directly from the ordered bit-channel index sequence used to determine the set of bit-channels of the Polar code used to carry data bits. As such, another key advantage may be that only one ordered index sequence may be stored, which can be used for both the determination of the set of information bit locations (i.e. information set) for a given code rate (or number of information bits) and the determination of the set of punctured code bit locations. Therefore, the overall storage may be reduced, which may be especially beneficial when the supported maximum code length is large. As still another example, another technical advantage provided by certain embodiments may be that the methods require virtually no additional effort in re-computing the information set based on the code length or the number of punctured bits.

Other advantages may be readily apparent to one having skill in the art. Certain embodiments may have none, some, or all of the recited advantages.

BRIEF DESCRIPTION OF THE DRAWINGS

For a more complete understanding of the disclosed embodiments and their features and advantages, reference is now made to the following description, taken in conjunction with the accompanying drawings, in which.

DETAILED DESCRIPTION

Particular embodiments of the present disclosure may provide methods and systems puncturing-based rate matching for Polar codes. Particular embodiments are described in FIGS. 4-12 of the drawings, like numerals being used for like and corresponding parts of the various drawings.

According to certain embodiments, methods and systems are disclosed that perform puncturing-based rate matching on the output of a Polar encoder based on the relative rankings of bit-channels (e.g., according to their relative reliabilities) used to determine the information bit locations (i.e., information set) used at different code rates at the input of the Polar encoder. The relative rankings of bit channels may be stored in terms of an ordered index sequence, which specifies the index of the bit channel of a particular rank, or, alternatively, in terms of an ordered ranking sequence, which directly specifies the rank of the bit channel with a particular index. Several methods of using the information bit-channel rankings are disclosed to generate a nested sequence of puncturing patterns for different number of punctured bits. According to a particular embodiment, puncturing may be started from the index of the highest rank to the index of the lowest rank, up to the point when the total number of punctured bits is reached, according to the ordered index sequence. According to another particular embodiment, puncturing may be started from the index of the lowest rank to the index of the highest rank, up to the point when the total number of punctured bits is reached, according to the ordered index sequence. Both methods may be used in the same system at different operating regions or parameters, such as code rate, direction of transmission (uplink vs. downlink), allocated resources, modulation, etc.

Figure 4:
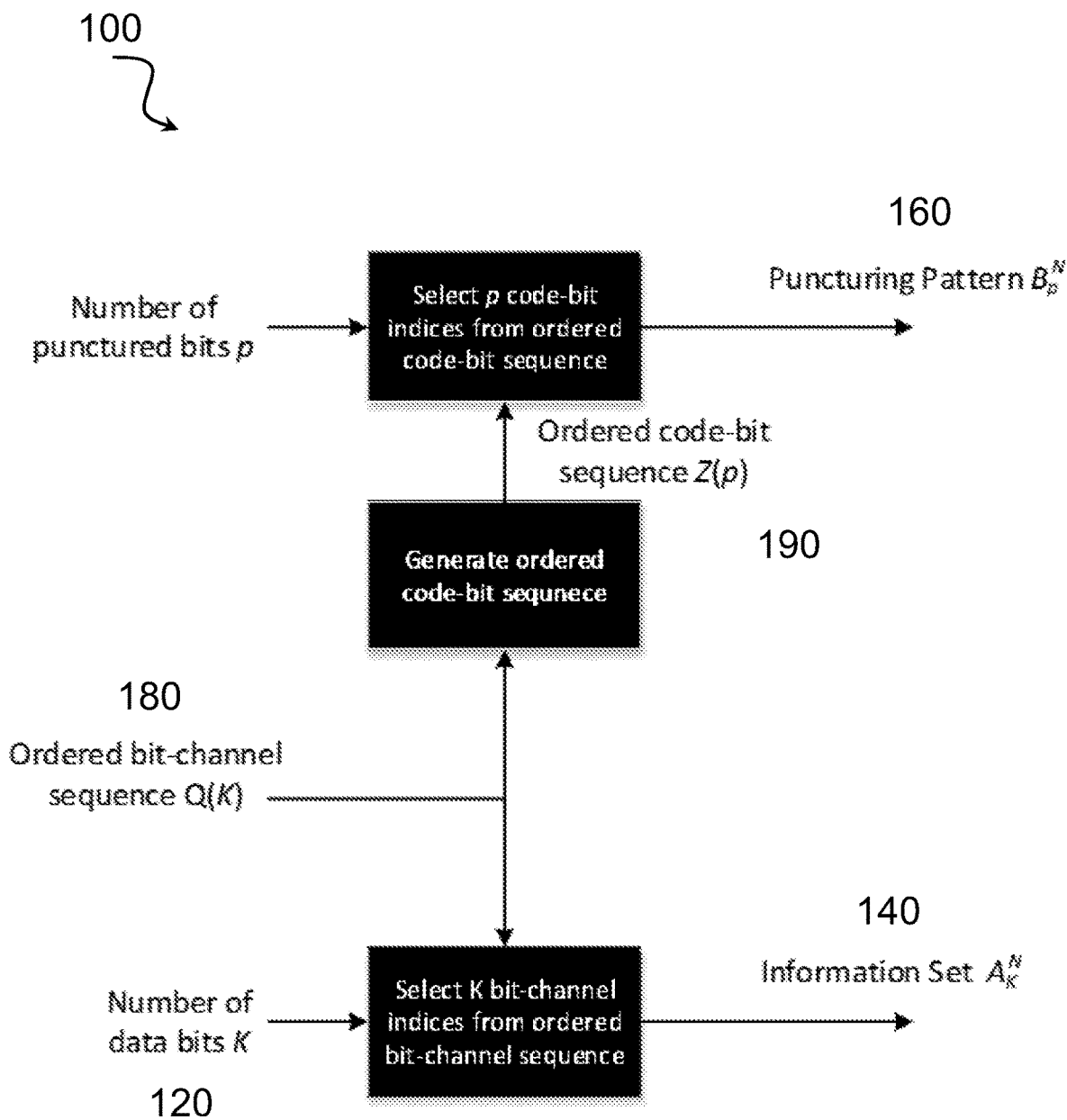
FIG. 4 illustrates an example method for determining a set of punctured code bit positions and information set, according to certain embodiments.

FIG. 4 illustrates a block diagram of process 100 of jointly determining the puncturing pattern and the information set, according to certain embodiments. Specifically, in order to encode a block of K data bits 120, the encoder of a Polar code of length N first determines the information set $A_K^N$ 140 that specifies when bit channels are frozen and which bit channels are used to carry the data bits at the input of the encoder. For additive white Gaussian channels (AWGN), the sequence of information sets $\{A_K^N:K=0, 1, \ldots, N\}$ is nested for different values of K in the sense that $A_0^N \subset A_1^N \subset A_2^N \subset \ldots \subset A_N^N$. Such a nested sequence of information sets can be characterized by an ordered bit-channel index sequence $Q:\{1, 2, \ldots, N\} \rightarrow \{1, 2, \ldots, N\}$, which specifies the index of the bit channel of a given rank such that Q(i) denotes the index of ith highest ranked bit-channel. The ranking of different bit-channels may be determined by their relative reliabilities, as measured by bit-error probability for example, in carrying data bit. Such an ordered bit-channel may be predetermined and stored at both the Polar encoder and the Polar decoder. Such a sequence may also be equivalently represented (and stored) by an ordered bit-channel ranking sequence $Q^{-1}:\{1, 2, \ldots, N\} \rightarrow \{1, 2, \ldots, N\}$ that provides the rank of the bit channel of a given index. The ordered bit-channel ranking sequence is the inverse of the ordered bit-channel index sequence in the sense that $Q^{-1}(Q(i))=i$ and $Q(Q^{-1}(i))=i$.

According to certain embodiments, in order to attain a target block length M that is not a power of two, the output of the encoder of a Polar code of length $N^{[log_2 M]}$ may be punctured so that the p≡(N−M) punctured bits are not transmitted to the receiver. The encoder of a Polar code that supports arbitrary block length M needs to determine the set $B_p^N$ 16 of indices of code bits to be punctured. This set $B_\mu^N$ 16 is often referred to as a puncturing pattern. Only those puncturing methods that generate a nested sequence of puncturing patterns $\{B_p^N:p=0, 1, \ldots, N\}$ such that $B_0^N \subset B_1^N \subset B_2^N \subset \ldots \subset B_N^N$ since a nested sequence of punctured patterns may be considered as a suitable for implementation in a circular or linear buffer, according to certain embodiments. Such a nested sequence of puncturing patterns may be characterized by an ordered code-bit index sequence $Z:\{1, 2, \ldots, N\} \rightarrow \{1, 2, \ldots, N\}$, which specifies the index of the code bit of a given rank such that Q(i) denotes the index of ith lowest ranked code bit. The punctured pattern is related to the ordered code-bit index sequence simply by $B_\mu^N = \{Z(i):i=1, 2, \ldots, p\}$. Such a sequence may also be equivalently represented (and stored) by an ordered code-bit ranking sequence $Z^{-1}:\{1, 2, \ldots, N\} \rightarrow \{1, 2, \ldots, N\}$ that provides the rank of the code bit of a given index. The ordered code-bit ranking sequence is the inverse of the ordered code-bit index sequence in the sense that $Z^{-1}(Z(i))=i$ and $Z(Z^{-1}(i))=i$.

According to certain embodiments, the nested sequence $\{B_p^N:p=0, 1, \ldots, N\}$ of puncturing patterns for different numbers of punctured code bits, p, or equivalently different target block lengths M, is derived from the nested sequence of information sets $\{A_K^N:K=0, 1, \ldots, N\}$. Two types of way of relating them, and thus resulting in two corresponding types of puncturing methods, are proposed:

Type I: $B_p^N \triangleq (A_{N-p}^N)^c$ for all $p=1,2,\ldots,N-1$ "Low-reliability-first"

Type II: $B_p^N \triangleq A_p^N$ for all $p=1,2,\ldots,N-1$ "High-reliability-first"

Where $X^c$ denotes the complement of the set X.

For Type I puncturing method, the code bit with an index equal to the least reliable bit-channel as specified by $\{(A_{N-p}^N)^c:p=1, 2, \Lambda, N-1\}$ is punctured first. The advantage of this puncturing method is that the set of indices of information bit channels used to carry data at the input of the encoder will never overlap with the set of indices of the punctured code bits. As a result, the information set is unchanged whether puncturing is done or not, and the generation of information set is independent of the number of punctured code bits or the target code block length.

For Type II puncturing method, the code bit with an index equal to the highest reliable bit-channel as specified by $\{A_p^N:p=1, 2, \Lambda, N-1\}$ is punctured first. The nested sequence of information set is exactly the same as the nested sequence of puncturing patterns. After the number of punctured bits, p, is known, the information set can be easily obtained by avoiding using bit-channels with indices associated with the punctured code bits.

For both types of puncturing methods, the ordered code-bit index sequence Z(i) can be derived from the ordered bit-channel index sequence Q(i) as follows:

Type I: $Z(p) \triangleq Q(N-p+1)$ for all $p=1,2,\ldots,N$ "Low-reliability-first"

Type II: $Z(P) \triangleq Q(p)$ for all $p=1,2,\ldots,N$ "High-reliability-first"

According to certain embodiments, based on the predetermined and pre-stored ordered bit channel sequence Q(K) 180, an ordered code-bit index sequence Z(p) 190 is generated according to one of the above equations, based on which the puncturing pattern is computed by $B_p^N = \{Z(i):i=1, 2, \ldots, p\}$. On the other hand, the information set can be generated from the same ordered bit-channel sequence Q(K) based on $A_K^N = \{Q(i):i=1, 2, \ldots, K\}$.

While low 'reliability' and 'high-reliability' are used to describe the indexing or ranking of bit locations, it is understood that the indexing and ranking can be generic, and not exactly according to the reliability. In other words, the methods can be applied for any way of indexing/ranking which generates an ordered sequence.

Figure 5:
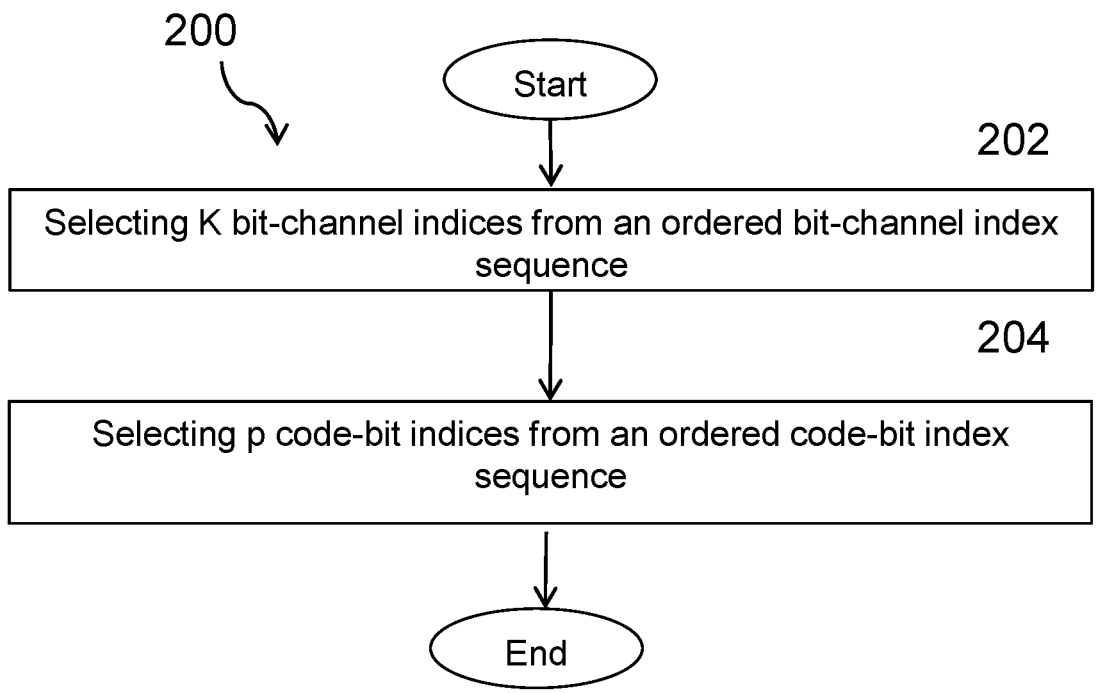
FIG. 5 illustrates an example method for puncturing-based rate matching for Polar codes, according to certain embodiments.

FIG. 5 illustrates an example method 200 by a transmitter for puncturing-based rate matching on an output of a Polar encoder, according to certain embodiments. The method begins at step 202 with the selection of K bit-channel indices from ordered bit-channel index sequence. In a particular embodiment, the K bit-channel indices are selected for a number of data bits, K. Stated differently, for a number of data bits (K), K bit-channels are selected from the ordered bit-channel index sequence.

At a step 204, p code-bit indices are selected from an ordered code-bit index sequence for a number of punctured bits (p). Thus, for a number of punctured bits (p), p code-bit indices are selected from the ordered code-bit index sequence.

According to certain embodiments, method 200 may be performed by a receiver and may further include filling each of the number of punctured bits (p) with a 0. The receiver may include a wireless device such as wireless device 610 described below with respect to FIGS. 9 and 10 or a network node such as network node 615 described below with respect to FIGS. 9 and 11.

According to certain other embodiments, method 200 may be performed by a transmitter and may further include dropping each of the number of punctured bits (p). The transmitter may include a wireless device such as wireless device 610 described below with respect to FIGS. 9 and 10 or a network node such as network node 615 described below with respect to FIGS. 9 and 11.

Figure 6:
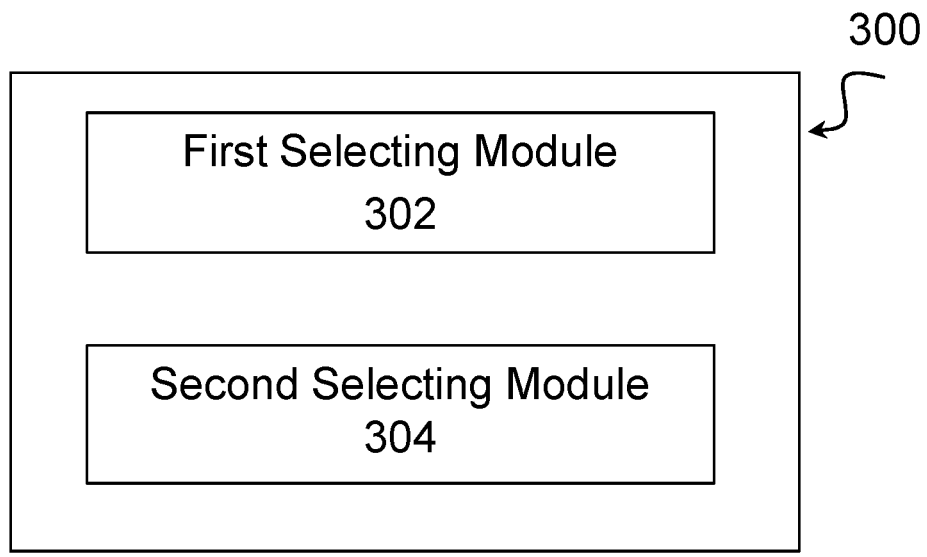
FIG. 6 illustrates an example virtual computing device for puncturing-based rate matching for Polar codes, according to certain embodiments.

In certain embodiments, the method for generating a puncturing pattern as described above may be performed by a virtual computing device. FIG. 6 illustrates an example virtual computing device 300 for puncturing-based rate matching for Polar codes, according to certain embodiments. In certain embodiments, virtual computing device 300 may include modules for performing steps similar to those described above with regard to the method illustrated and described in FIG. 5. For example, virtual computing device 300 may include a first selecting module 302, a generating module 304, a second selecting module 306, and any other suitable modules for generating a puncturing pattern. In some embodiments, one or more of the modules may be implemented using processing circuitry such as processing circuitry 720 of FIG. 10 or processing circuitry 820 of FIG. 11. In certain embodiments, the functions of the modules may be combined so as to be performed by fewer modules or divided so as to be performed by more modules.

The first selecting module 302 may perform certain of the selecting functions of virtual computing device 300. For example, in a particular embodiment, first selecting module 302 may select K bit-channel indices from ordered bit-channel sequence. In a particular embodiment, the K bit-channel indices is selected for a number of data bits, K. Thus, for a number of data bits (K), K bit-channels are selected from the ordered bit-channel index sequence.

The second selecting module 304 may perform certain of the selecting functions of virtual computing device 300. For example, in a particular embodiment, second selecting module 304 may select, for a number of punctured bits (p), p code-bit indices from the ordered code-bit index sequence.

Other embodiments of virtual computing device 300 may include additional components beyond those shown in FIG. 6 that may be responsible for providing certain aspects of the apparatus's functionality, including any of the functionality described above and/or any additional functionality (including any functionality necessary to support the solutions described above). The various different types of apparatus, including wireless devices 410 and network nodes 415 (described below), may include components having the same physical hardware but configured (e.g., via programming) to support different radio access technologies, or may represent partly or entirely different physical components.

Figure 7:
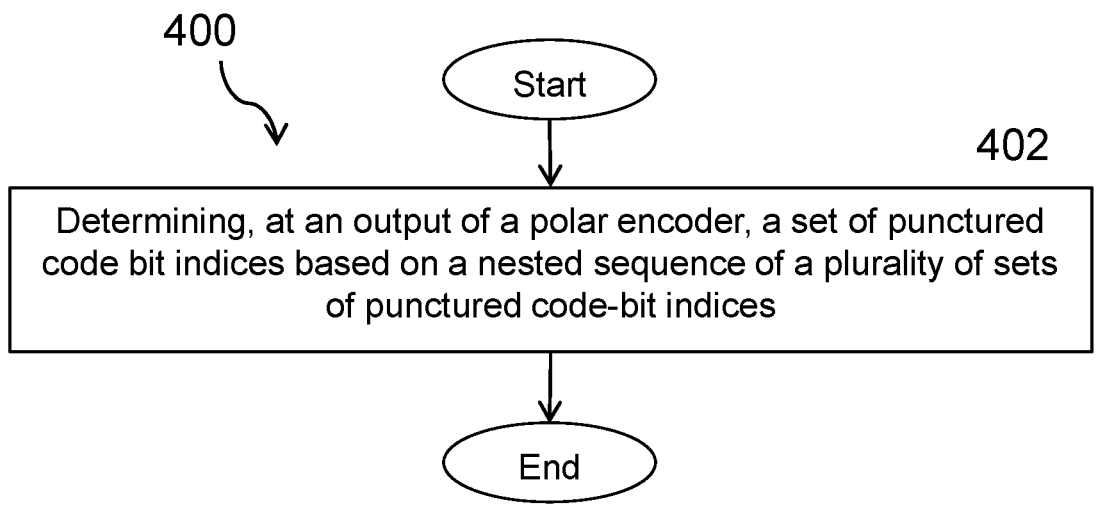
FIG. 7 illustrates another example method for puncturing-based rate matching for Polar codes, according to certain embodiments.

FIG. 7 illustrates an example method 400 by a transmitter, according to certain embodiments. In a particular embodiment, the transmitter may include a wireless device such as wireless device 610 described below with respect to FIGS. 9 and 10. In another particular embodiment, the transmitter may include a network node such as network node 615 described below with respect to FIGS. 9 and 11.

At step 402, the transmitter determines, at an output of a Polar encoder, a set of punctured code bit indices based on a nested sequence of a plurality of sets of punctured code-bit indices.

In a particular embodiment, the nested sequence may be specified by an ordered code-bit index sequence. In another particular embodiment, the nested sequence may be derived from a relative ranking of a plurality of bit channels at the input of the Polar encoder. The relative ranking of the plurality of bit channels may be specified by a nested sequence of information sets. Alternatively, the relative ranking may be specified by an ordered bit-channel index sequence that specifies an index of a particular bit channel at each rank.

In still another embodiment, the relative ranking of the plurality of bit channels may be specified by an ordered ranking sequence that provides a rank of a code bit of a particular index. For example, each set of the plurality of sets of punctured code-bit indices is a complement of a particular information set in the nested sequence of information sets.

According to certain embodiments, the method may further include using the set of punctured code bit indices to determine at least one bit to drop from a plurality of bits to be transmitted and transmitting the plurality of bits other than the at least one dropped bit. In a particular embodiment, for example, each set of the plurality of sets of punctured code-bit indices may be a particular information set in the nested sequence of information sets.) Specifically, in a particular embodiment, each set, $B_p^N = \{Z(i):i=1, 2, \ldots, p\}$, of punctured code-bit indices may be derived from one or more indices at the end of the ordered bit-channel index sequence, Q(i), as follows:

$$Z(p) \triangleq Q(N-p+1) \text{ for all } p=1,2,\ldots,N$$

where N is a length of a Polar code, p is the number of punctured bits and Z(p) is an ordered code-bit index sequence. In this scenario, the transmitter may drop at least one low reliability bit from the output of the Polar encoder.

In another particular embodiment, each set, $B_p^N = \{Z(i): i=1, 2, \ldots, p\}$, of punctured code-bit indices may be derived from one or more indices at the beginning of the ordered bit-channel index sequence, Q(i), as follows:

$$Z(p) \triangleq Q(p) \text{ for all } p=1,2,\ldots,N$$

where N is a length of a Polar code, p is the number of punctured bits and Z(p) is an ordered code-bit index sequence. In this scenario, the transmitter may drop at least one high reliability bit from the output of the Polar encoder.

Figure 8:
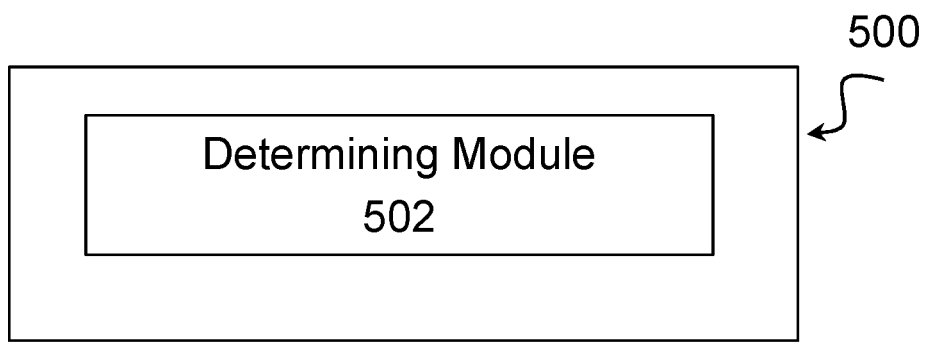
FIG. 8 illustrates another example virtual computing device for puncturing-based rate matching for Polar codes, according to certain embodiments.

In certain embodiments, the method for generating a puncturing pattern as described above may be performed by a virtual computing device. FIG. 8 illustrates an example virtual computing device 500 for puncturing-based rate matching for Polar codes, according to certain embodiments. In certain embodiments, virtual computing device 500 may include modules for performing steps similar to those described above with regard to the method illustrated and described in FIG. 8. For example, virtual computing device 500 may include a determining module 502, and any other suitable modules for generating a puncturing pattern. In some embodiments, one or more of the modules may be implemented using processing circuitry such as processing circuitry 720 of FIG. 10 or processing circuitry 820 of FIG. 11. In certain embodiments, the functions of the modules may be combined so as to be performed by fewer modules or divided so as to be performed by more modules.

The determining module 502 may perform certain of the determining functions of virtual computing device 500. For example, in a particular embodiment, determining module 502 may determine, at an output of a Polar encoder, a set of punctured code bit indices based on a nested sequence of a plurality of sets of punctured code-bit indices.

Other embodiments of virtual computing device 500 may include additional components beyond those shown in FIG. 5 that may be responsible for providing certain aspects of the apparatus's functionality, including any of the functionality described above and/or any additional functionality (including any functionality necessary to support the solutions described above). The various different types of apparatus, including wireless devices 610 and network nodes 615 (described below), may include components having the same physical hardware but configured (e.g., via programming) to support different radio access technologies, or may represent partly or entirely different physical components.

Figure 9:
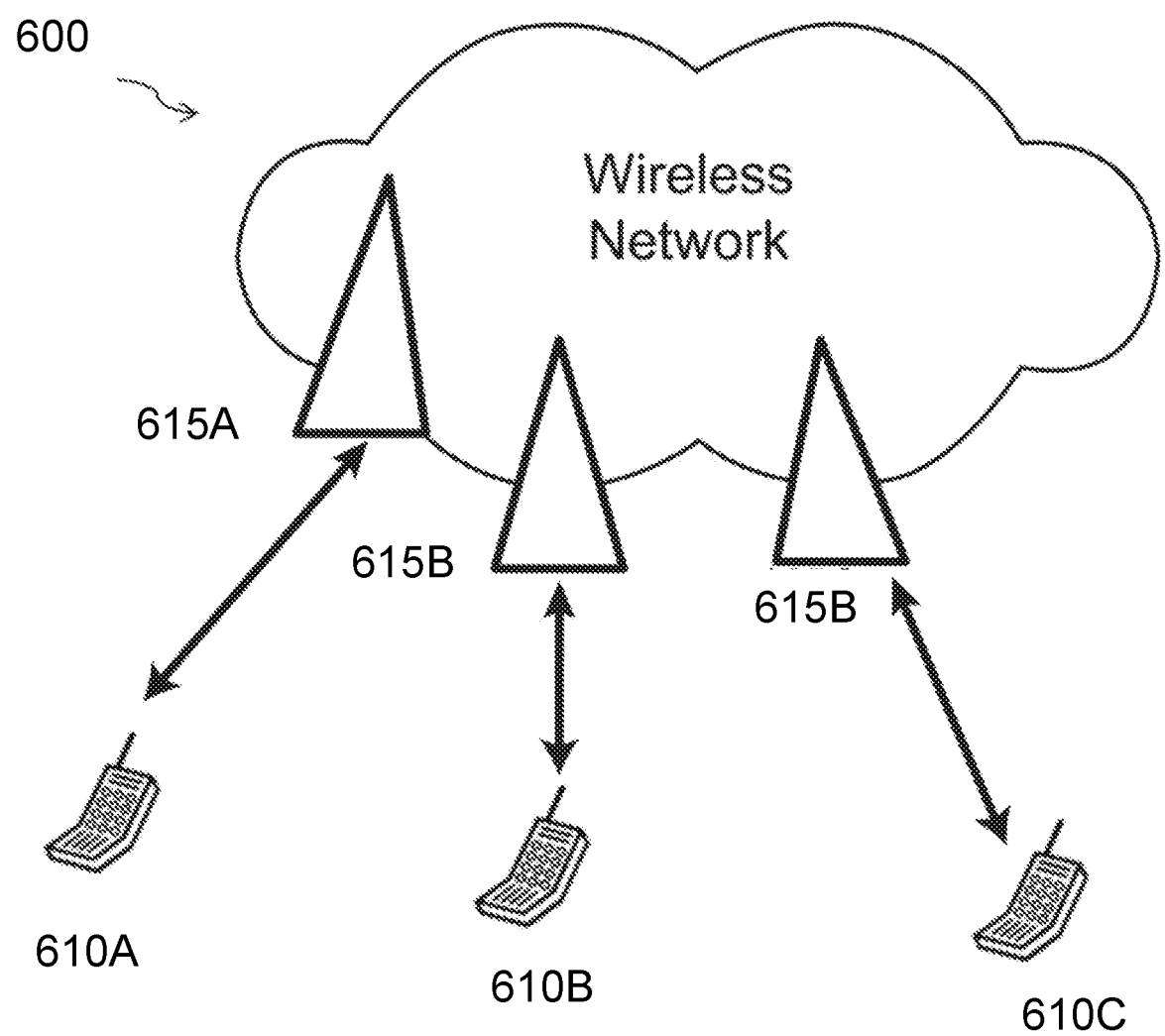
FIG. 9 illustrates an example wireless network for puncturing-based rate matching for Polar codes, according to certain embodiments.

FIG. 9 illustrates a wireless network 600 for puncturing-based rate matching for Polar codes, in accordance with certain embodiments. Network 600 includes one or more wireless devices 610A-C, which may be interchangeably referred to as wireless devices 610 or UEs 610, and network nodes 615A-C, which may be interchangeably referred to as network nodes 615 or eNodeBs 615. A wireless device 610 may communicate with network nodes 615 over a wireless interface. For example, wireless device 610A may transmit wireless signals to one or more of network nodes 615, and/or receive wireless signals from one or more of network nodes 615. The wireless signals may contain voice traffic, data traffic, control signals, and/or any other suitable information. In some embodiments, an area of wireless signal coverage associated with a network node 615 may be referred to as a cell. In some embodiments, wireless devices 610 may have D2D capability. Thus, wireless devices 610 may be able to receive signals from and/or transmit signals directly to another wireless device 610. For example, wireless device 610A may be able to receive signals from and/or transmit signals to wireless device 610B.

In certain embodiments, network nodes 615 may interface with a radio network controller (not depicted in FIG. 9). The radio network controller may control network nodes 615 and may provide certain radio resource management functions, mobility management functions, and/or other suitable functions. In certain embodiments, the functions of the radio network controller may be included in network node 615. The radio network controller may interface with a core network node. In certain embodiments, the radio network controller may interface with the core network node via an interconnecting network. The interconnecting network may refer to any interconnecting system capable of transmitting audio, video, signals, data, messages, or any combination of the preceding. The interconnecting network may include all or a portion of a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, or any other suitable communication link, including combinations thereof.

In some embodiments, the core network node may manage the establishment of communication sessions and various other functionalities for wireless devices 610. Wireless devices 610 may exchange certain signals with the core network node using the non-access stratum layer. In non-access stratum signaling, signals between wireless devices 610 and the core network node may be transparently passed through the radio access network. In certain embodiments, network nodes 615 may interface with one or more network nodes over an internode interface. For example, network nodes 615A and 615B may interface over an X2 interface.

As described above, example embodiments of network 600 may include one or more wireless devices 610, and one or more different types of network nodes capable of communicating (directly or indirectly) with wireless devices 610. Wireless device 610 may refer to any type of wireless device communicating with a node and/or with another wireless device in a cellular or mobile communication system. Examples of wireless device 610 include a target device, a device-to-device (D2D) capable device, a machine type communication (MTC) device or other UE capable of machine-to-machine (M2M) communication, a mobile phone or other terminal, a smart phone, a PDA (Personal Digital Assistant), a portable computer (e.g., laptop, tablet), a sensor, a modem, laptop embedded equipment (LEE), laptop mounted equipment (LME), USB dongles, ProSe UE, V2V UE, V2X UE, MTC UE, eMTC UE, FeMTC UE, UE Cat 0, UE Cat M1, narrowband Internet of Things (NB-IoT) UE, UE Cat NB1, or another device that can provide wireless communication. A wireless device 610 may also be referred to as UE, a station (STA), a device, or a terminal in some embodiments. Also, in some embodiments, generic terminology, "radio network node" (or simply "network node") is used. It can be any kind of network node, which may comprise a Node B, base station (BS), multi-standard radio (MSR) such as MSR BS, eNode B, MeNB, SeNB, a network node belonging to MCG or SCG, network controller, radio network controller (RNC), base station controller (BSC), relay donor node controlling relay, base transceiver station (BTS), access point (AP), transmission points, transmission nodes, RRU, RRH, nodes in distributed antenna system (DAS), core network node (e.g. MSC, MME etc.), O&M, OSS, SON, positioning node (e.g. E-SMLC), MDT, test equipment, or any suitable network node. The term "radio node" as used here in may refer to any network node or wireless device. Example embodiments of wireless devices 610, network nodes 615, and other network nodes (such as radio network controller or core network node) are described in more detail with respect to FIGS. 10, 11, and 12, respectively.

Although FIG. 9 illustrates a particular arrangement of network 600, the present disclosure contemplates that the various embodiments described herein may be applied to a variety of networks having any suitable configuration. For example, network 600 may include any suitable number of wireless devices 610 and network nodes 615, as well as any additional elements suitable to support communication between wireless devices or between a wireless device and another communication device (such as a landline telephone). Furthermore, although certain embodiments may be described as implemented in a long-term evolution (LTE) network, the embodiments may be implemented in any appropriate type of telecommunication system supporting any suitable communication standards and using any suitable components and are applicable to any LTE based systems such as MTC, eMTC, and NB-IoT. As an example, MTC UE, eMTC UE, and NB-IoT UE may also be called UE category 0, UE category M1 and UE category NB1, respectively. However, the embodiments are applicable to any radio access technology (RAT) or multi-RAT systems in which the wireless device receives and/or transmits signals (e.g., data). For example, the various embodiments described herein may also be applicable to, LTE-Advanced, and LTE-U UMTS, LTE FDD/TDD, WCDMA/HSPA, GSM/GERAN, WiFi, WLAN, cdma2000, WiMax, 5G, New Radio (NR), another suitable radio access technology, or any suitable combination of one or more radio access technologies. It is noted that 5G, the fifth generation of mobile telecommunications and wireless technology is not yet fully defined but in an advanced draft stage with 3GPP. It includes work on 5G New Radio (NR) Access Technology. LTE terminology is used herein in a forward-looking sense, to include equivalent 5G entities or functionalities although a different term may be specified in 5G. A general description of the agreements on 5G NR Access Technology is contained in most recent versions of the 3GPP 38-series Technical Reports. Although certain embodiments may be described in the context of wireless transmissions in the downlink, the present disclosure contemplates that the various embodiments are equally applicable in the uplink and vice versa. The described techniques are generally applicable for transmissions from both network nodes 615 and wireless devices 610.

Figure 10:
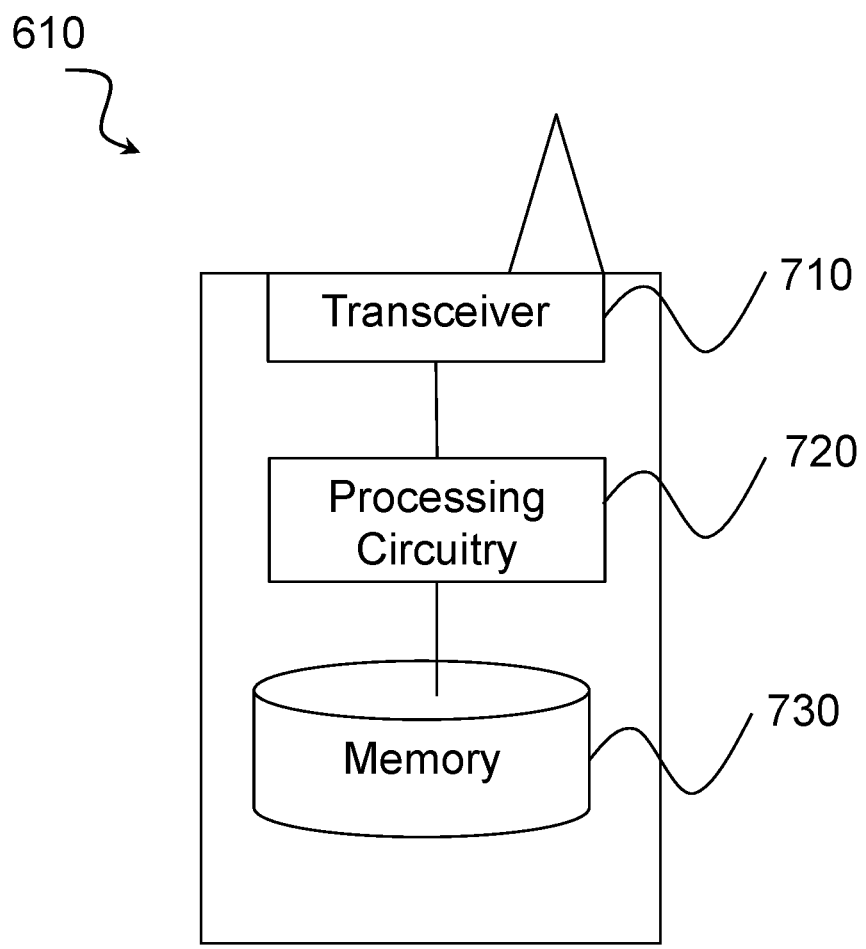
FIG. 10 illustrates an example wireless device for puncturing-based rate matching for Polar codes, according to certain embodiments.

FIG. 10 illustrates an example wireless device 610 for puncturing-based rate matching for Polar codes, in accordance with certain embodiments. As depicted, wireless device 610 includes transceiver 710, processing circuitry 720, and memory 730. In some embodiments, transceiver 710 facilitates transmitting wireless signals to and receiving wireless signals from network node 615 (e.g., via an antenna), processing circuitry 720 executes instructions to provide some or all of the functionality described above as being provided by wireless device 610, and memory 730 stores the instructions executed by processing circuitry 720. Examples of a wireless device 610 are provided above.

Processing circuitry 720 may include any suitable combination of hardware and software implemented in one or more modules to execute instructions and manipulate data to perform some or all of the described functions of wireless device 610. In some embodiments, processing circuitry 720 may include, for example, one or more computers, one or more central processing units (CPUs), one or more processors, one or more microprocessors, one or more applications, and/or other logic.

Memory 730 is generally operable to store instructions, such as a computer program, software, an application including one or more of logic, rules, algorithms, code, tables, etc. and/or other instructions capable of being executed by processing circuitry. Examples of memory 730 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

Other embodiments of wireless device 610 may include additional components beyond those shown in FIG. 10 that may be responsible for providing certain aspects of the wireless device's functionality, including any of the functionality described above and/or any additional functionality (including any functionality necessary to support the solution described above).

Figure 11:
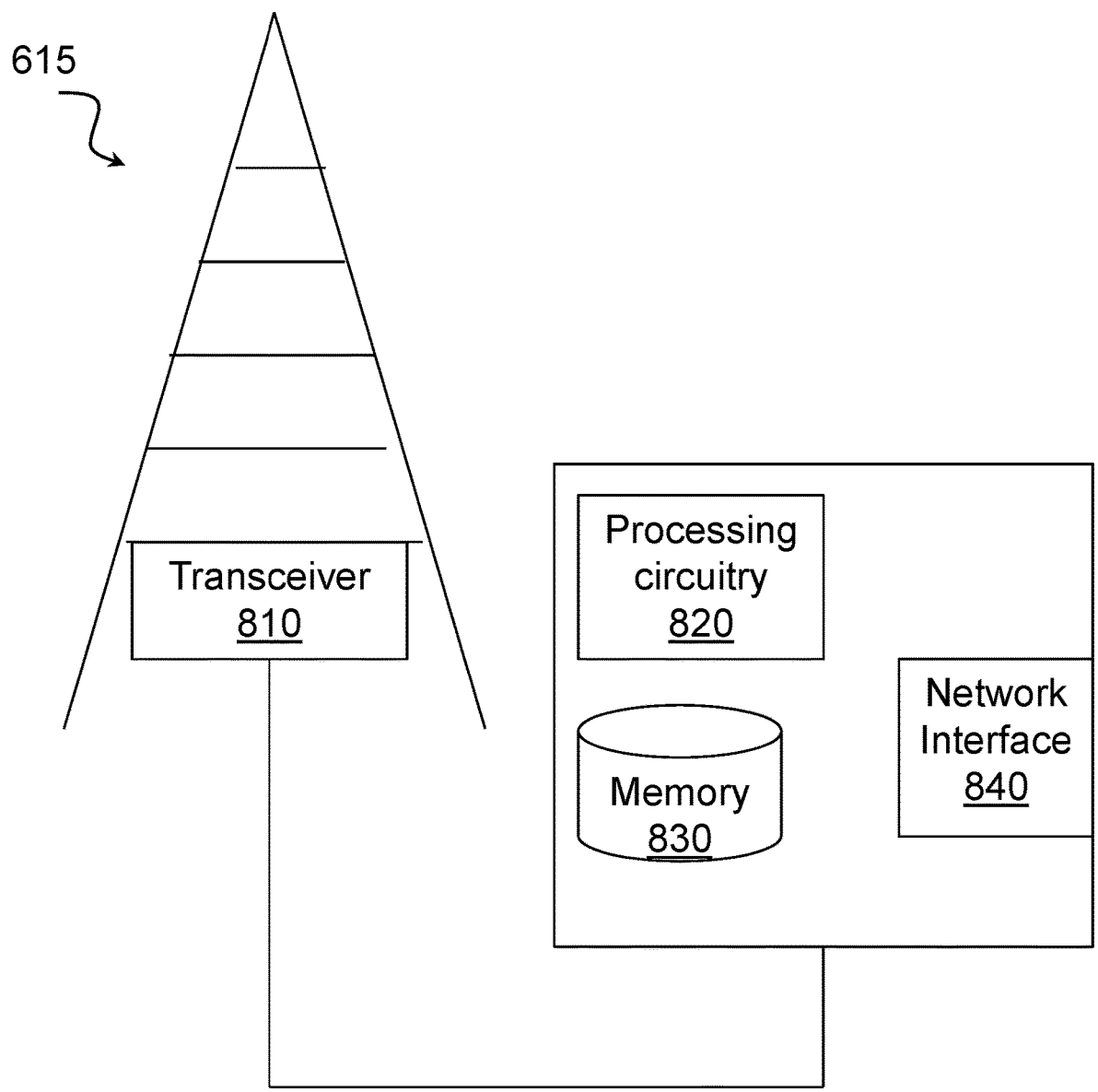
FIG. 11 illustrate an example network node for puncturing-based rate matching for Polar codes, according to certain embodiments.

FIG. 11 illustrate an example network node 615 for puncturing-based rate matching for Polar codes, according to certain embodiments. As described above, network node 615 may be any type of radio network node or any network node that communicates with a wireless device and/or with another network node. Examples of a network node 615 are provided above.

Network nodes 615 may be deployed throughout network 600 as a homogenous deployment, heterogeneous deployment, or mixed deployment. A homogeneous deployment may generally describe a deployment made up of the same (or similar) type of network nodes 615 and/or similar coverage and cell sizes and inter-site distances. A heterogeneous deployment may generally describe deployments using a variety of types of network nodes 615 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 615 may include one or more of transceiver 80, processing circuitry 820, memory 830, and network interface 840. In some embodiments, transceiver 810 facilitates transmitting wireless signals to and receiving wireless signals from wireless device 610 (e.g., via an antenna), processing circuitry 820 executes instructions to provide some or all of the functionality described above as being provided by a network node 615, memory 830 stores the instructions executed by processing circuitry 820, and network interface 840 communicates signals to backend network components, such as a gateway, switch, router, Internet, Public Switched Telephone Network (PSTN), core network nodes or radio network controllers, etc.

In certain embodiments, network node 615 may be capable of using multi-antenna techniques and may be equipped with multiple antennas and capable of supporting MIMO techniques. The one or more antennas may have controllable polarization. In other words, each element may have two co-located sub elements with different polarizations (e.g., 90 degree separation as in cross-polarization), so that different sets of beamforming weights will give the emitted wave different polarization.

Processing circuitry 820 may include any suitable combination of hardware and software implemented in one or more modules to execute instructions and manipulate data to perform some or all of the described functions of network node 615. In some embodiments, processing circuitry 820 may include, for example, one or more computers, one or more central processing units (CPUs), one or more microprocessors, one or more applications, and/or other logic.

Memory 830 is generally operable to store instructions, such as a computer program, software, an application including one or more of logic, rules, algorithms, code, tables, etc. and/or other instructions capable of being executed by a processor. Examples of memory 830 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 840 is communicatively coupled to processing circuitry 820 and may refer to any suitable device operable to receive input for network node 615, send output from network node 615, perform suitable processing of the input or output or both, communicate to other devices, or any combination of the preceding. Network interface 840 may include appropriate hardware (e.g., port, modem, network interface card, etc.) and software, including protocol conversion and data processing capabilities, to communicate through a network.

Other embodiments of network node 615 may include additional components beyond those shown in FIG. 11 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components. Additionally, the terms first and second are provided for example purposes only and may be interchanged.

Figure 12:
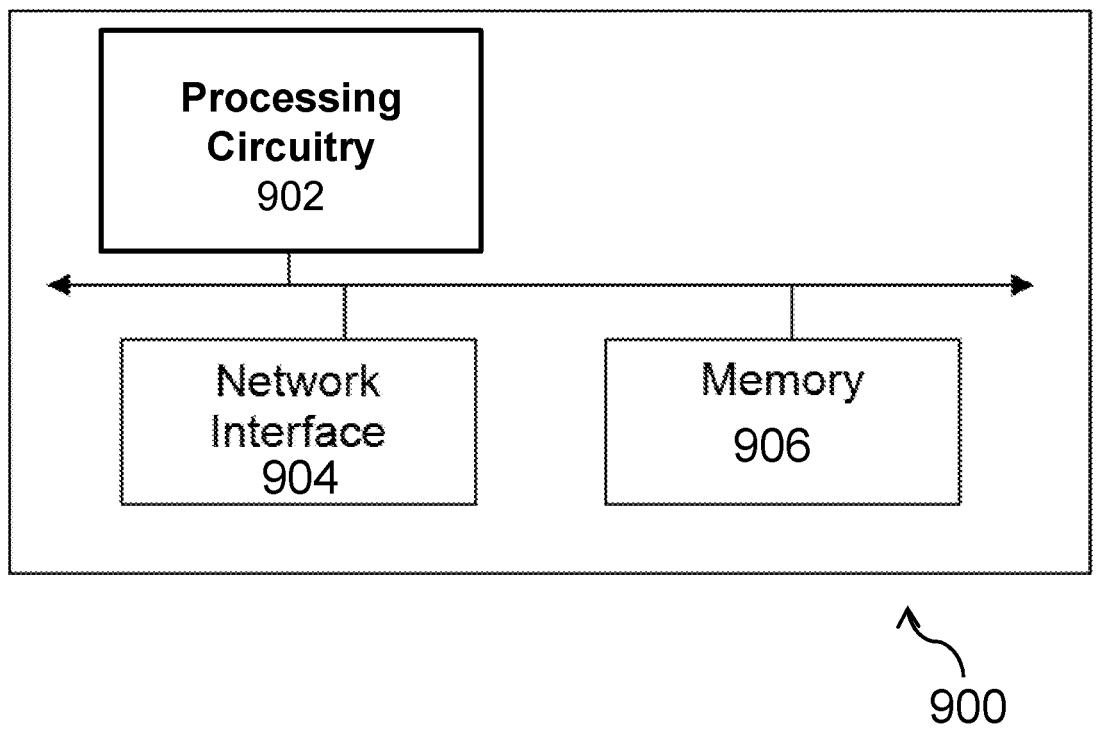
FIG. 12 illustrates an exemplary radio network controller or core network node, according to certain embodiments.

FIG. 12 illustrates an exemplary radio network controller or core network node 900, in accordance with certain embodiments. Examples of network nodes 900 can include a mobile switching center (MSC), a serving GPRS support node (SGSN), a mobility management entity (MME), a radio network controller (RNC), a base station controller (BSC), and so on. The radio network controller or core network node 900 includes processing circuitry 920, memory 930, and network interface 940. In some embodiments, processing circuitry 920 executes instructions to provide some or all of the functionality described above as being provided by the network node, memory 930 stores the instructions executed by processing circuitry 920, and network interface 940 communicates signals to any suitable node, such as a gateway, switch, router, Internet, Public Switched Telephone Network (PSTN), network nodes 615, radio network controllers or core network nodes 900, etc.

Processing circuitry 920 may include any suitable combination of hardware and software implemented in one or more modules to execute instructions and manipulate data to perform some or all of the described functions of the radio network controller or core network node 900. In some embodiments, processing circuitry 920 may include, for example, one or more computers, one or more central processing units (CPUs), one or more microprocessors, one or more applications, and/or other logic.

Memory 930 is generally operable to store instructions, such as a computer program, software, an application including one or more of logic, rules, algorithms, code, tables, etc. and/or other instructions capable of being executed by a processor. Examples of memory 930 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 940 is communicatively coupled to processing circuitry 920 and may refer to any suitable device operable to receive input for the network node, send output from the network node, perform suitable processing of the input or output or both, communicate to other devices, or any combination of the preceding. Network interface 940 may include appropriate hardware (e.g., port, modem, network interface card, etc.) and software, including protocol conversion and data processing capabilities, to communicate through a network.

Other embodiments of the network node may include additional components beyond those shown in FIG. 12 that may be responsible for providing certain aspects of the network node's functionality, including any of the functionality described above and/or any additional functionality (including any functionality necessary to support the solution described above).

According to certain embodiments, a method may include:

determining, at an output of a Polar encoder, a set of punctured code bit indices based on an ordered code-bit index sequence;

optionally, the ordered code-bit index sequence specifies the index of the code bit at each rank;

optionally, the ordered code-bit index sequence is stored by the relative ranking of each code bit as specified by the order;

optionally, the ordered code-bit index sequence is derived from the relative rankings of information bit-channels (at the input of a Polar encoder);

optionally, the relative rankings of information bit-channels are specified by an ordered bit-channel index sequence that specifies the index of the bit channel at each rank;

optionally, the relative rankings of information bit-channels is specified by an ordered bit-channel ranking sequence that specifies the rank of each bit channel having a particular index;

optionally, the set of punctured code bit indices are determined by using the first P indices of the ordered code-bit index sequence;

optionally, the set of punctured code bit indices are determined by using the last P indices of the ordered code-bit index sequence;

optionally, the set of punctured code bit indices are determined by using the first P indices of the ordered bit-channel index sequence;

optionally, the set of punctured code bit indices are determined by using the last P indices of the ordered bit-channel index sequence;

According to certain embodiments, a wireless device may include:
processing circuitry, the processing circuitry configured to:
determine, at an output of a Polar encoder, a set of punctured code bit indices based on an ordered code-bit index sequence;
optionally, the ordered code-bit index sequence specifies the index of the code bit at each rank;
optionally, the ordered code-bit index sequence is stored by the relative ranking of each code bit as specified by the order;
optionally, the ordered code-bit index sequence is derived from the relative rankings of information bit-channels (at the input of a Polar encoder);
optionally, the relative rankings of information bit-channels are specified by an ordered bit-channel index sequence that specifies the index of the bit channel at each rank;
optionally, the relative rankings of information bit-channels is specified by an ordered bit-channel ranking sequence that specifies the rank of each bit channel having a particular index;
optionally, the set of punctured code bit indices are determined by using the first p indices of the ordered code-bit index sequence;
optionally, the set of punctured code bit indices are determined by using the last p indices of the ordered code-bit index sequence;
optionally, the set of punctured code bit indices are determined by using the first p indices of the ordered bit-channel index sequence;
optionally, the set of punctured code bit indices are determined by using the last p indices of the ordered bit-channel index sequence;

According to certain embodiments, a method for generating a puncturing pattern may include:
selecting K bit-channel indices from ordered bit-channel sequence;
generating an ordered code-bit sequence;
for a number of punctured bits (p), selecting p code-bit indices from the ordered code-bit sequence;
optionally, the K bit channel indices is selected for a number of data bits, K; and
optionally, the ordered code-bit sequence is generated based on an ordered bit-channel sequence.

According to certain embodiments, an apparatus for generating a puncturing pattern may include:
processing circuitry, the processing circuitry configured to:
selecting K bit-channel indices from ordered bit-channel sequence;
generating an ordered code-bit sequence;
for a number of punctured bits (p), selecting p code-bit indices from the ordered code-bit sequence;
optionally, the K bit channel indices is selected for a number of data bits, K; and
optionally, the ordered code-bit sequence is generated based on an ordered bit-channel sequence.

Certain embodiments of the present disclosure may provide one or more technical advantages. For example, certain embodiments derive an ordered code-bit index sequence directly from the ordered bit-channel index sequence used to determine the set of bit-channels of the Polar code used to carry data bits. As such, another key advantage may be that only one ordered index sequence is stored, which can be used for both the determination of the set of information bit locations (i.e. information set) for a given code rate (or number of information bits) and the determination of the set of punctured code bit locations. Therefore, the overall storage may be reduced, which may be especially beneficial when the supported maximum code length is large. As still another example, another technical advantage provided by certain embodiments may be that the methods require virtually no additional effort in re-computing the information set based on the code length or the number of punctured bits.

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the disclosure. The methods may include more, fewer, or other steps. Additionally, steps may be performed in any suitable order.

Figure 1:
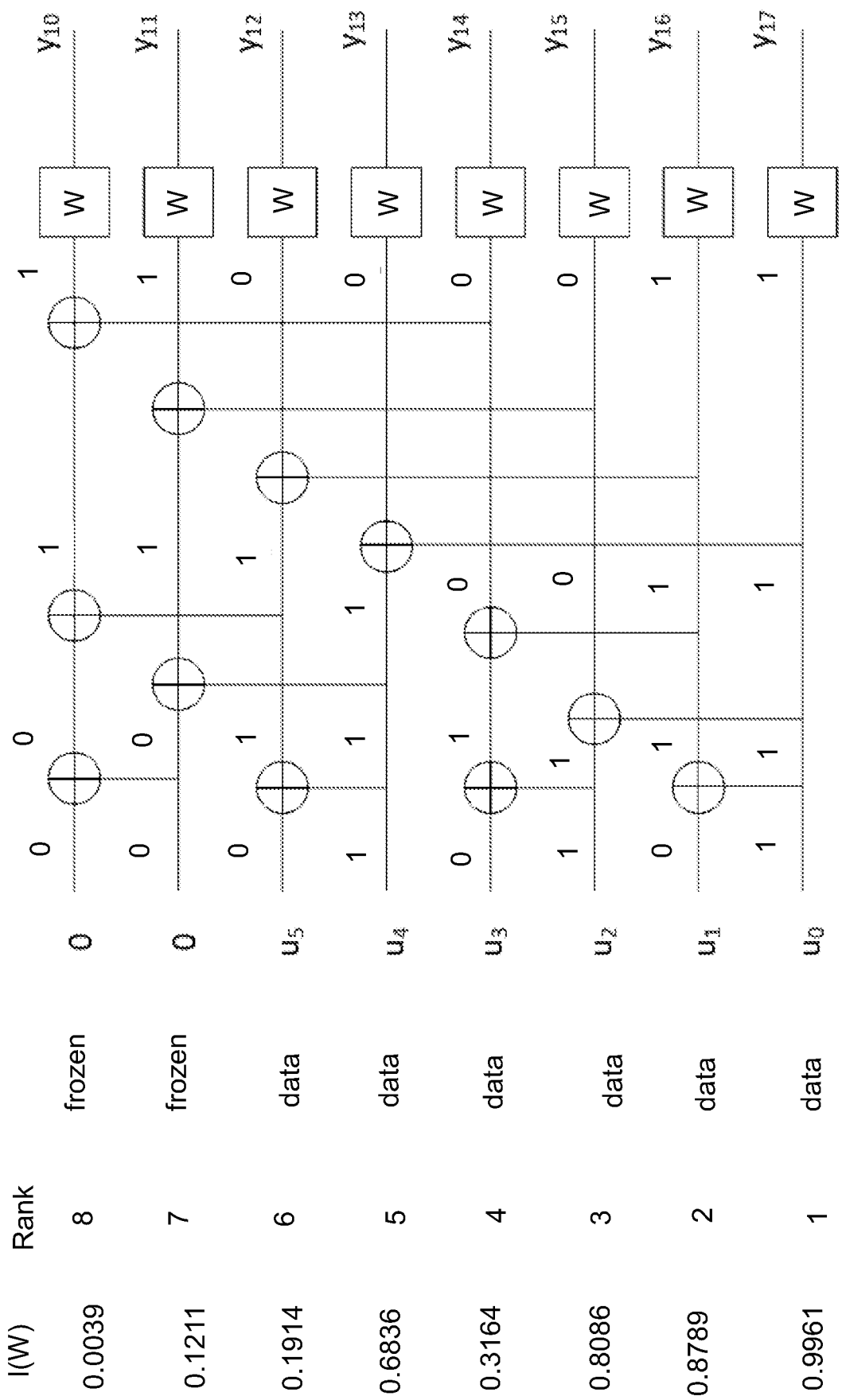
FIG. 1 illustrates an example Polar code structure.
Figure 2:
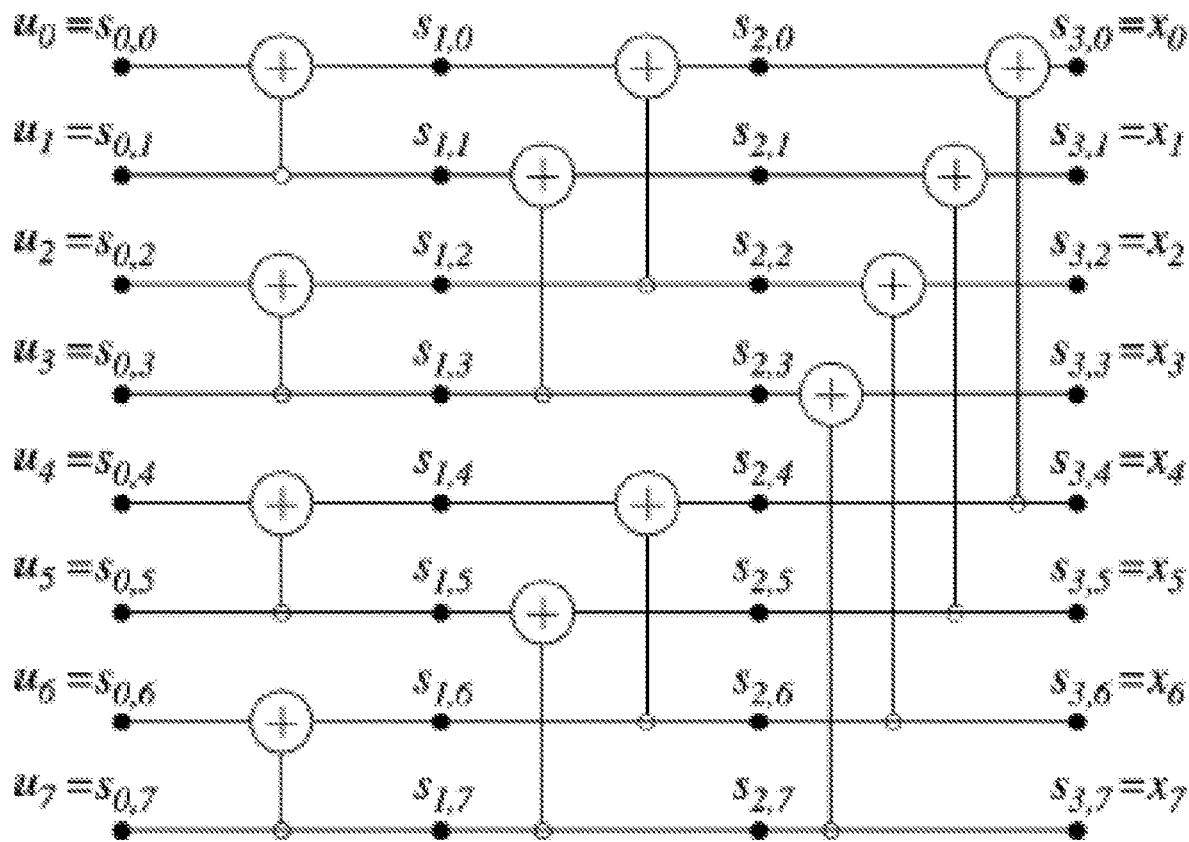
FIG. 2 illustrates an example Polar code encoder.
Figure 3:
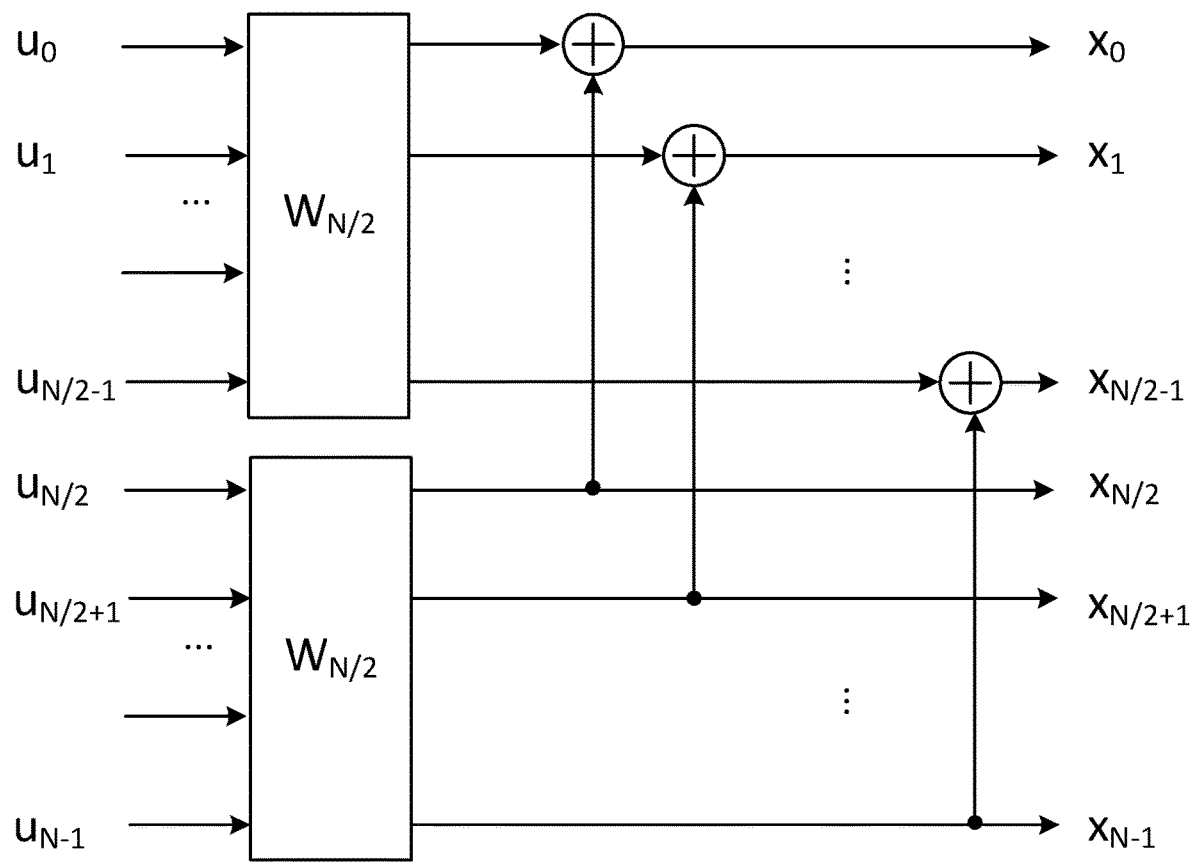
FIG. 3 illustrates an example recursive Polar encoding construction.

As just one example modification, it is recognized that the indices arrangement depicted in FIG. 2 is only one example of a general indices arrangement. Other ways of arranging the input/output indices are possible and may achieve the same net effect of encoding. The disclosed methods can be modified accordingly for other ways of indexing without departing from the spirit of the invention.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

Abbreviations used in the preceding description include:

| Abbreviation | Explanation |
| --- | --- |
| SC | Successive Cancellation |
| SCL | Successive Cancellation List |
| QAM | Quadrature Amplitude Modulation |
| LLR | Log Likelihood Ratio |
| OFDM | Orthogonal Frequency Division Multiplex |
| DFTS OFDM | Discrete Fourier Transform Spread OFDM |
| NR | New Radio |
| PBCH | Physical Broadcast Channel |
| PDSCH | Physical Downlink Shared Channel |
| PUSCH | Physical Uplink Shared Channel |
| SIB | System Information Block |
| UCI | Uplink Control Information |
| DCI | Downlink Control Information |
| HARQ | Hybrid Automatic Repeat Request |
| IR-HARQ | Incremental Redundancy HARQ |

The invention claimed is:
1. A method by a transmitter comprises:
determining, at an output of a Polar encoder, a set of punctured code bit indices based on a nested sequence of a plurality of sets of punctured code-bit indices, and wherein the nested sequence of the plurality of sets of punctured code-bit indices is derived from a ranking of a plurality of bit channels at the input of the Polar encoder, and wherein the plurality of bit channels are ranked according to their relative reliabilities, and transmitting the nested sequence.

2. The method of claim 1, wherein the nested sequence of the plurality of sets of punctured code-bit indices is specified by an ordered code-bit index sequence.

3. The method of claim 1, wherein the relative ranking of the plurality of bit channels is specified by a nested sequence of information sets.

4. The method of claim 1, wherein the relative ranking of the plurality of bit channels is specified by an ordered bit-channel index sequence that specifies an index of a particular bit channel at each rank.

5. The method of claim 4, wherein:

each set $B_p^N=\{Z(i):i=1, 2, \ldots, p\}$ of punctured code-bit indices is derived from one or more indices at the end of the ordered bit-channel index sequence, Q(i), as follows:

$Z(p) \triangleq Q(N-p+1)$ for all $p=1,2,\ldots,N$ where N is a length of a Polar code, p is the number of punctured bits, and Z(p) is an ordered code-bit index sequence; and the method further comprises dropping at least the lowest reliability bit from the output of the Polar encoder.

6. A method by a transmitter for puncturing-based rate-matching on an output of a Polar encoder, the method comprising:

selecting K bit-channel indices from an ordered bit-channel index sequence; and selecting p code-bit indices from an ordered code-bit index sequence, wherein for a number of data bits (K), K bit-channels are selected from the ordered bit-channel index sequence, and wherein for a number of punctured bits (p), p code-bit indices are selected from the ordered code-bit index sequence, and wherein the ordered code-bit index sequence is generated based on a ranking of a plurality of bit channels at the input of the Polar encoder as associated with the ordered bit-channel sequence, and wherein the plurality of bit channels are ranked according to their relative reliabilities, and transmitting the generated sequence.

7. A transmitter comprising:

processing circuitry, the processing circuitry configured to:

determine, at an output of a Polar encoder, a set of punctured code bit indices based on a nested sequence of a plurality of sets of punctured code-bit indices, and wherein the nested sequence of the plurality of sets of punctured code-bit indices is derived from a ranking of a plurality of bit channels at the input of the Polar encoder, and wherein the plurality of bit channels are ranked according to their relative reliabilities, and transmit the nested sequence.

8. The transmitter of claim 7, wherein the nested sequence of the plurality of sets of punctured code-bit indices is specified by an ordered code-bit index sequence.

9. The transmitter of claim 7, wherein the relative ranking of the plurality of bit channels is specified by a nested sequence of information sets.

10. The transmitter of claim 7, wherein the relative ranking of the plurality of bit channels is specified by an ordered bit-channel index sequence that specifies an index of a particular bit channel at each rank.

11. The transmitter of claim 10, wherein:

each set, $B_p^N=\{Z(i):i=1, 2, \ldots, p\}$ of punctured code-bit indices is derived from one or more indices at the end of the ordered bit-channel index sequence, Q(i), as follows:

$Z(p) \triangleq Q(N-p+1)$ for all $p=1,2,\ldots,N$ where N is a length of a Polar code, p is the number of punctured bits and Z(p) is an ordered code-bit index sequence; and the method further comprises dropping at least one low reliability bit from the output of the Polar encoder.

12. The transmitter of claim 10, wherein:

each set, $B_p^N=\{Z(i):i=1, 2, \ldots, p\}$, of punctured code-bit indices is derived from one or more indices at the beginning of the ordered bit-channel index sequence, Q(i), as follows:

$Z(p) \triangleq Q(p)$ for all $p=1,2,\ldots,N$ where N is a length of a Polar code, p is the number of punctured bits and Z(p) is an ordered code-bit index sequence; and the method further comprises dropping at least one high reliability bit from the output of the Polar encoder.

13. The transmitter of claim 7, where the relative ranking of the plurality of bit channels is specified by an ordered ranking sequence $Z^{-1}: \{1, 2, \ldots, N\} \to \{1, 2, \ldots, N\}$ that provides a rank of a code bit of a particular index.

14. The transmitter of claim 7, wherein each set of the plurality of sets of punctured code-bit indices is a complement of a particular information set in the nested sequence of information sets.

15. The transmitter of claim 7, wherein each set of the plurality of sets of puncturing code-bit indices is a particular information set in the nested sequence of information sets.

16. The transmitter of claim 7, wherein the processing circuitry is further configured to:

based on the set of punctured code bit indices, determine at least one bit to drop from a plurality of bits to be transmitted; and transmit the plurality of bits other than the at least one dropped bit.

17. The transmitter of claim 7, wherein the transmitter is a wireless device.

18. The transmitter of claim 7, wherein the transmitter is a network node.

19. A radio node comprising:

processing circuitry, the processing circuitry configured to:

select K bit-channel indices from an ordered bit-channel index sequence; and select p code-bit indices from an ordered code-bit index sequence, wherein for a number of data bits (K), K bit-channels are selected from the ordered bit-channel index sequence, and wherein for a number of punctured bits (p), p code-bit indices are selected from the ordered code-bit index sequence, and wherein the ordered code-bit index sequence is generated based on a ranking of a plurality of bit channels at the input of the Polar encoder as associated with the ordered bit-channel sequence, and wherein the plurality of hit channels are ranked according to their relative reliabilities, and transmit the generated sequence.

20. The radio node of claim 19, wherein the radio node is a receiver and the processing circuitry is further configured to:

fill each of the number of punctured bits (p) with a 0.

21. The radio node of claim 20, wherein the receiver or the transmitter comprises a wireless device.

22. The radio node of claim 20, wherein the receiver or the transmitter comprises a network node.

23. The radio node of claim 19, wherein the radio node is a transmitter and the processing circuitry is further configured to:

drop each of the number of punctured bits (p).

\* \* \* \* \*